United States Patent
Kapur

(10) Patent No.: US 6,240,542 B1
(45) Date of Patent: May 29, 2001

(54) POLY ROUTING FOR CHIP INTERCONNECTS WITH MINIMAL IMPACT ON CHIP PERFORMANCE

(75) Inventor: Rajiv Kapur, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/115,464

(22) Filed: Jul. 14, 1998

(51) Int. Cl.[7] .................................................. G06F 17/50
(52) U.S. Cl. .................................. 716/12; 716/13; 716/6
(58) Field of Search ................................ 716/12, 13, 14, 716/15, 2, 6

(56) References Cited

U.S. PATENT DOCUMENTS

| | | | |
|---|---|---|---|
| 4,516,312 | * 5/1985 | Tomita | 29/571 |
| 4,591,993 | * 5/1986 | Griffin et al. | 716/2 |
| 4,593,362 | * 6/1986 | Bergeron et al. | 716/14 |
| 4,852,016 | * 7/1989 | McGehee | 716/12 |
| 4,888,299 | * 12/1989 | Shiraishi et al. | 716/12 |
| 5,353,235 | * 10/1994 | Do et al. | 716/14 |
| 5,379,231 | * 1/1995 | Pillage et al. | 364/488 |
| 5,471,409 | * 11/1995 | Tani | 364/578 |
| 5,566,080 | * 10/1996 | Yokoi | 364/491 |
| 5,724,557 | * 3/1998 | McBean, Sr. | 716/6 |
| 5,974,247 | * 10/1999 | Yonezawa | 716/3 |
| 6,006,024 | * 12/1999 | Guruswamy et al. | 716/12 |

OTHER PUBLICATIONS

Fujii et al., "A Multi–Layer Channel Router w/ New Style of Over–the–Cell Routing" 29th ACM/IEEE Design Automation Conference, pp 585–588, 1992.*

* cited by examiner

*Primary Examiner*—Matthew Smith
*Assistant Examiner*—Leigh Marie Garbowski
(74) *Attorney, Agent, or Firm*—Mitchell, Silberberg & Knupp LLP

(57) ABSTRACT

Methods for using the polysilicon layer to route the cells in the ASIC are disclosed. The poly layer of an IC chip is used for routing chip interconnects with minimal impact on the chip performance by selecting nets in the IC chip based on a predetermined or a desired qualification. A maximum allowable length of the poly layer to be used for chip interconnects is determined based on the intended technology of the chip. A filtering algorithm filters the netlist to provide a set of candidate nets that are suitable for poly layer routing based on the predetermined or desired qualification. A routing tool routes the selected nets that have been selected by the filtering algorithm by using the poly layer. Some of the poly layer routings are further rejected by a post processing step.

47 Claims, 5 Drawing Sheets

POLY ROUTING FOR CHIP INTERCONNECTS WITH MINIMAL IMPACT ON CHIP PERFORMANCE

BACKGROUND OF THE INVENTION

1. Field of the Invention

The present invention generally relates to the art of microelectronic integrated circuits. In particular, the present invention relates to the art of utilizing polysilicon routing for chip interconnects.

2. Description of the Prior Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

A. IC Configuration.

An exemplary integrated circuit chip is illustrated in FIG. 1 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

B. Layout Design Process.

The input to the physical design problem is a circuit diagram, and the output is the layout of the circuit. This is accomplished in several stages including partitioning, floor planning, placement, routing and compaction.

1. Partitioning.

A chip may contain several million transistors. Layout of the entire circuit cannot be handled due to the limitation of memory space as well as the computation power available. Therefore, the layout is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

2. Floor Planning and Placement.

This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

3. Routing.

The objective of the routing phase is to complete the interconnections between blocks according to the specified netlist. First, the space not occupied by blocks, which is called the routing space, is partitioned into rectangular regions called channels. The goal of a router is to complete all circuit connections using the shortest possible wire length and using only the channel.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes the exact channel routing of wires.

Many algorithms have been developed for efficient routing of the cells in the integrated circuits. Although many existing prior art routing algorithms try to reduce the die area taken up by routing by finding the shortest or the best route, the prior art algorithms are limited to just using metal layers for routing the chip interconnects.

FIG. 2 provides a simplified cross-sectional view of a typical integrated circuit chip (or die) 50. As shown in FIG. 2, chip 50 includes a semiconductor substrate 59, metal layers 51 to 54, electrically insulating layers 56, and passivation layer 58. Semiconductor substrate 59, which is typically polysilicon, is used for forming the transistors and other electronic devices.

Metal layers 51 to 54 may be formed from any of a variety of materials including aluminum, copper or an electrically conductive alloy. Typically, two to six metal layers are formed on top of substrate 59. As stated before, the prior art algorithms just use the metal layers for routing the cells. Between metal layers 51 and 52, 52 and 53, and 53 and 54, and between metal layers 51 and substrate 59 is an electrically insulating layer 56, which typically is formed as an oxide film. Connections between any of metal layers 51 to 54 and semiconductor substrate 59 are made using interlayer holes called vias. Passivation layer 58 functions to prevent the deterioration of the electrical properties of the die caused by water, ions and other external contaminants, and typically is made of a scratch-resistant material such as silicon nitride and/or silicon dioxide.

The prior art routing algorithms have not considered the polysilicon (poly) layer for routing, but have limited the use of the polysilicon layer to standard cell layouts only. There are many reasons for such limitations: the lack of need for additional resources for routing, the lack of emphasis on die size reduction, the lack of knowledge of poly layer routing techniques and, mostly importantly, the belief that poly layer is unsuitable for routing, especially from a timing perspective.

However, as the number of transistors in integrated circuits continues to increase, the amount of metal layer routing needed to connect all of cells in the chip continues to increase dramatically, and such increase in the amount of routing may impose a constraint on the design of the chip if the increased routing occupies too much space on the die and not enough space is available for cell layout. The real estate on a given die size may be in short supply because of the increase in the number of transistors and routings, and such shortage may further increase the congestion of metal layers used for routing the chip interconnects. New methods are needed to relieve the congestion of metal layers in order to accommodate ever increasing number of transistors and to reduce the die size.

SUMMARY OF THE INVENTION

It is an object of the present invention to provide methods for using the polysilicon layer to route the cells in the ASIC, which obviate for practical purposes the above mentioned limitations.

According to an embodiment of the invention, the poly layer of an IC chip is used for routing chip interconnects with minimal impact on the chip performance by selecting nets in the IC chip based on a predetermined or a desired qualification. In particular embodiments of the present invention, a maximum allowable length of the poly layer to be used for chip interconnects is determined based on the intended technology of the chip and the tolerable amount of degradation in the performance of the chip which may appear when the poly layer is used for routing. A filtering algorithm filters the netlist to provide a set of candidate nets that are suitable for poly layer routing based on the predetermined or desired qualification. The filtering algorithm rejects the nets in the netlist based on the predetermined or desired qualification which includes the number of terminals in each net and the length of the routing when compared against the maximum allowable poly layer length. A routing tool routes the selected nets that have been selected by the filtering algorithm by using the poly layer. Some of the poly layer routings are further rejected by a post processing step.

Other features and advantages of the invention will become apparent from the following detailed description, taken in conjunction with the accompanying drawings which illustrate, byway of example, various features of embodiments of the invention.

DESCRIPTION OF THE PREFERRED EMBODIMENT(S)

Figure 1:
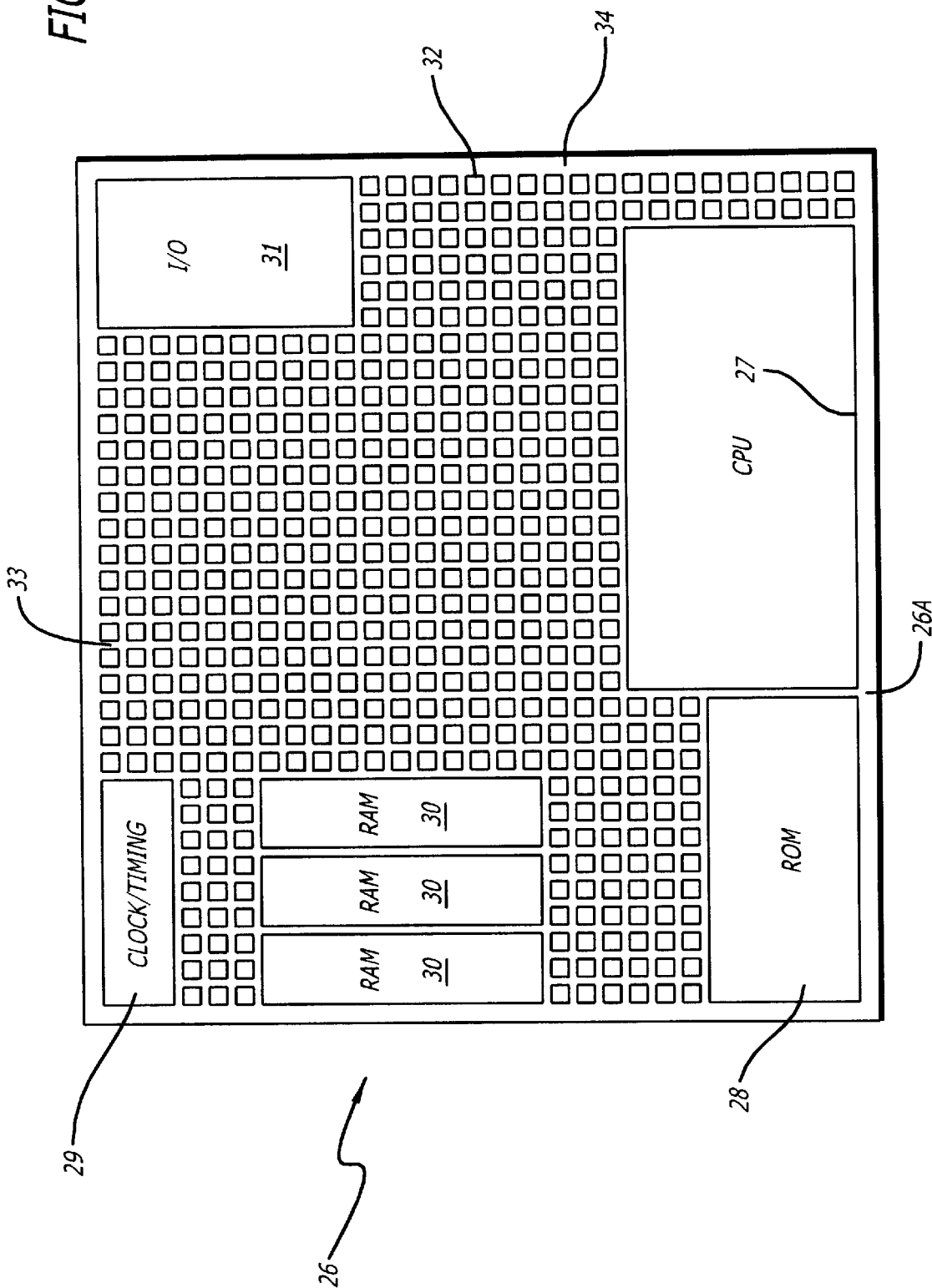
FIG. 1 is a simplified illustration of an integrated circuit chip on semiconductor material.
Figure 2:
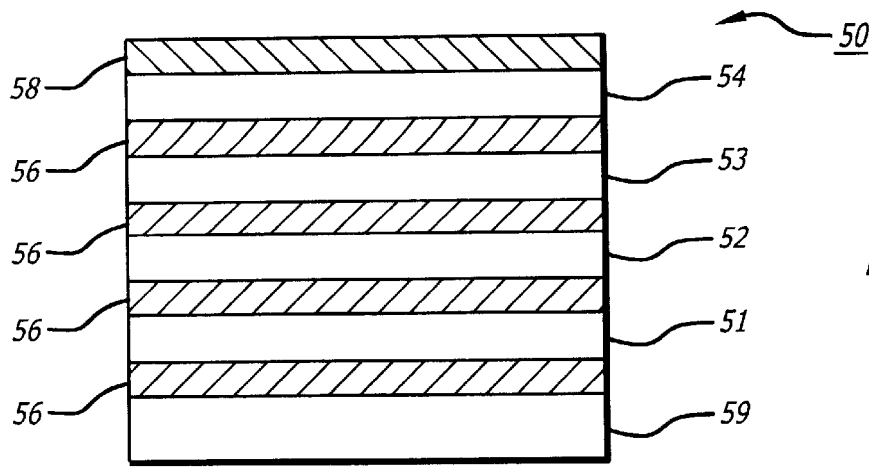
FIG. 2 is a simplified illustration of a cross-sectional view of an integrated circuit die which includes four metal layers.
Figure 3:
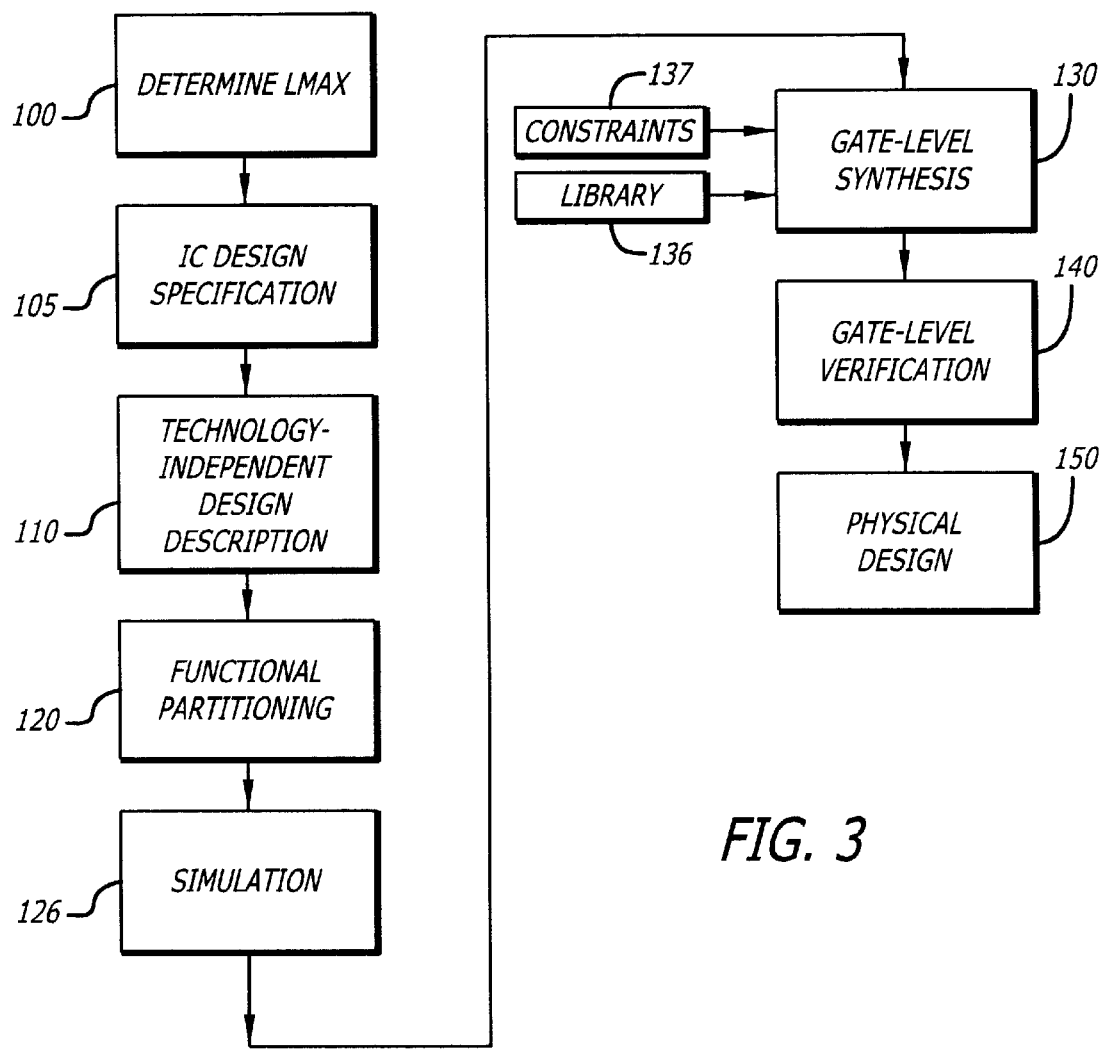
FIG. 3 is a flow diagram for illustrating integrated circuit design according to a preferred embodiment of the invention.

FIG. 3 illustrates a flow diagram for providing an overview of ASIC chip design according to preferred embodiments of the present invention. It should be understood that the description contained herein are in terms of a suite of software "blocks" used in a CAD system that can be run on any suitable computer system.

It should be noted that the underlying database used by the CAD system in accordance with preferred embodiments of the present invention needs to include the modeling of the poly layer in the database. For example, a CAD system, which just uses metal layers for routing, may not be including the modeling of the poly layer, poly ports and wires internal to the cells in the abstraction of the standard cells contained in the standard cell library. Basically, for a matter of convenience, the abstraction of the standards cells contained in the standard cell library may omit poly layer information including a via layer connection to the metal-1 layer because such information is not needed if only the metal layers are used for routing the chip interconnects. The poly layer information and wires internal to the cells may just appear as blockages in the abstraction of the cells, instead of being revealed in their true form.

However, such information is necessary in order to use the poly layer for routing the chip interconnects because without such information, the software blocks in the CAD system do not know the locations of the poly layer and poly ports. Therefore, an underlying database used in a CAD system in accordance with preferred embodiments of the present invention needs to include the poly layer modeling information and the information regarding poly ports, internal wires and via layer connections to the metal-1 layer so that the software blocks in the CAD system can utilize the information to route the chip interconnects by using the poly layer in addition to using the metal layers. The routing tool especially needs the poly layer modeling information since the routing tool is responsible for routing the chip interconnects.

In step 100, based upon the intended technology (e.g., 0.2 micron CMOS technology) to be used in the ASIC design, the maximum allowable length of the poly layer (hereinafter "LMAX") to be used for the routing is determined. The calculation for LMAX is based on the parasitics of the poly layer in the intended technology and the tolerable amount of degradation in the performance of the ASIC which may appear when the poly layer is used for routing instead of the metal layers in certain cases. The parasitics of the poly layer includes the sheet resistance and the parasitic line capacitance of the poly layer. The sheet resistance and the parasitic capacitance may vary depending on the intended technology to be used in the ASIC design.

Figure 4:
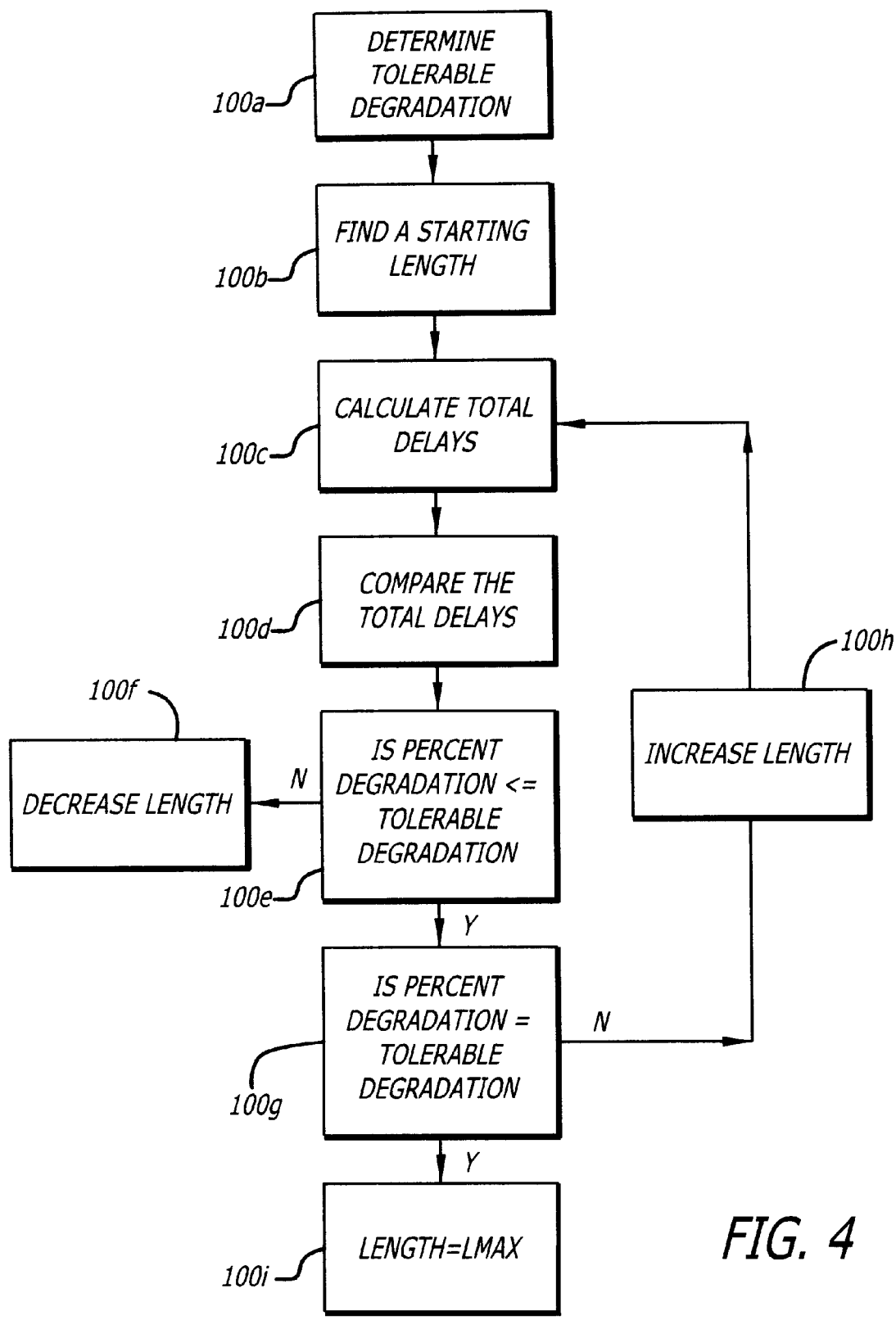
FIG. 4 is a flow diagram for illustrating integrated circuit design according to a preferred embodiment of the invention.

FIG. 4 illustrates the procedure used to determine LMAX. In step 100a, a tolerable amount of degradation in the performance of the ASIC is first determined based on the desired performance of the ASIC. When the poly layer is used instead of the metal layers for routing certain cells, a certain amount of degradation in the performance of the ASIC may appear when the performance is compared against a performance of an ASIC routed by solely using the metal layers. Specifically, because the poly layer has higher resistance and parasitic capacitance than the metal layers, a signal traveling on the poly layer may face longer delays and slower slew rates than when the signal is traveling on the metal layers. As the length of the poly layer gets longer, a signal traveling on the poly layer will face longer delays and slower slew rates. Overall, the longer delays and the slower slew rates may affect the speed and the performance of the ASIC chip. So, the designer first needs to determine the amount of degradation in the performance of ASIC that the designer can tolerate. For example, if the designer can build an ASIC running at 10 MHz by just using the metal layers for routing but only needs an ASIC running at 9 MHz, the designer can tolerate 10% degradation in the performance of the ASIC.

Next, based upon the determined overall tolerable degradation in the speed and performance of the ASIC chip, a tolerable amount of degradation in the delay and the slew rate of the signals traveling on the poly layer needs to be determined. For example, if the ASIC can only tolerate 10% degradation in performance, the 10% tolerable degradation may translate into or amount to 15% degradation in the delay and the slew rate of the signals traveling on the poly layer. As a result, a maximum allowable length of the poly layer that would not degrade the delay and the slew rate past the 15% mark can be determined. In other words, if a tolerable degradation of 15% is determined for the delay and the slew rate based on the overall tolerable degradation in the performance of the ASIC chip, a signal traveling on a poly layer of length $L_0$ must have a total delay which is less than or equal to 115% of the total delay that the same signal will face while traveling on a metal layer of same length $L_0$. So, if the total delay (which includes the slew rate) of a signal traveling on a metal layer is 10 ns, the same signal must have a total delay of 11.5 ns or less when the signal is traveling on a poly layer of same length. The degradation in the delay and the slew rate will increase as the length of the poly layer also increases. Therefore, it is necessary to determine the maximum allowable length of the poly layer. The tolerable degradation for the delay and the slew rate will vary depending on the overall tolerable degradation in the performance of the ASIC chip and the intended technology used to design the chip.

In step 100b, after the tolerable amount of degradation for the delay and the slew rate has been determined in step 100a, a starting length for the poly layer which will be used in the simulation of step 100c will be chosen. Basically, a variable called LENGTH will be initially set equal to a value of $L_0$ which is chosen based on an estimation.

In step 100c, a simulation engine takes LENGTH and calculates the total delay of a poly layer having a length of LENGTH. The total delay of the poly layer having the length of LENGTH will disclose the worst case delay for a routing having a length of LENGTH. The simulation engine then takes LENGTH and calculates the total delay of a metal layer having a length of LENGTH.

In step 100d, the total delay of the poly layer is compared against the total delay of the metal layer. Based on the comparison, the amount of the degradation in the total delay time is calculated for the poly layer having a length of LENGTH. The following equation expresses the percentage of degradation in the total delay time:

$$\text{percent degradation} = \frac{\text{total delay of poly layer} - \text{total delay of metal layer}}{\text{total delay of metal layer}}$$

In step 100e, the calculated percentage of the degradation is compared against the tolerable degradation calculated in step 100a. If the calculated percentage is greater than the tolerable degradation, the procedure moves to step 100f which decreases the value of LENGTH and loops back to step 100c, which takes the new value of LENGTH and calculates new total delays based on the new value of LENGTH. If the calculated percentage is less than or equal to the tolerable degradation, the procedure proceeds to step 100g. Step 100g determines whether the calculated percentage is equal to the tolerable degradation or not. If the calculated percentage is equal or approximately equal to the tolerable degradation, the value contained in LENGTH will be used as the maximum allowable poly layer length of LMAX and the procedure ends in step 100i. However, if the calculated percentage is less than the tolerable degradation, the value of LENGTH is slightly increased in step 100h, and the process loops back to step 100c which calculates new delays based on the new value of LENGTH. The above described procedure in step 100 is repeated until the value of LMAX is determined. The value of LMAX will be used in the following steps of preferred embodiments of the present invention.

In step 105, an IC system design specification is prepared. The preparation in step 105 consists of system or device specification and may include functional specifications of subsystem elements, timing specifications and I/O requirements, and power, package and interface requirements. At this initial step of the design cycle, the desired system design is described in the highest level of abstraction.

In step 110, a technology-independent description is produced by formulating a behavioral description of the circuit's desired behavior in a high-level hardware description language (HDL), such as VHDL or Verilog-HDL. Instead of being formulated in a behavioral description, the technology-independent description can also be formulated in a register-transfer level (RTL) description of the circuit in terms of predesigned functional blocks, such as memories and registers. The technology-independent description consists of functional description of the design and all of its subsystem elements that satisfy the IC design specification prepared in step 100.

In step 120, the technology-independent description formulated in step 110 is functionally partitioned into separate modules that will make the overall synthesis, analysis and verification tasks more manageable. The partitioning process consults technology files containing packaging, I/O capabilities and other technology-dependent information to optimally partition the design.

The technology-independent description is simulated in step 126 to ensure that it conforms to the desired behavioral description.

In step 130, a gate-level, technology dependent description is synthesized based on the technology-independent description from step 127 by preferably running an automated synthesis tool on the input technology-independent description. During step 130, physically realizable gates and clock recipients such as flip-flops, latches and registers are selected from a pre-defined library 136 and are interconnected in a manner so as to satisfy the relationships and to perform the processing defined by the technology-independent description. Preferably, step 130 utilizes pre-defined user design constraints 137 which have been formulated in an effort to enhance the feasibility of the design, particularly with respect to problems which might otherwise not be discovered until later in the design cycle. The gate level description is usually given in the form of a net list from which a device can be automatically physically created.

In gate-level verification step 140, a computer simulation is run to test the circuit design synthesized during gate-level synthesis step 130. The goals of this simulation are to determine whether all performance criteria have been met and whether any timing or other circuit errors will occur in response to a variety of different input signals and conditions. Upon completion of gate-level verification step 140, the netlist from the gate-level description is provided to physical design step 150.

Figure 5:
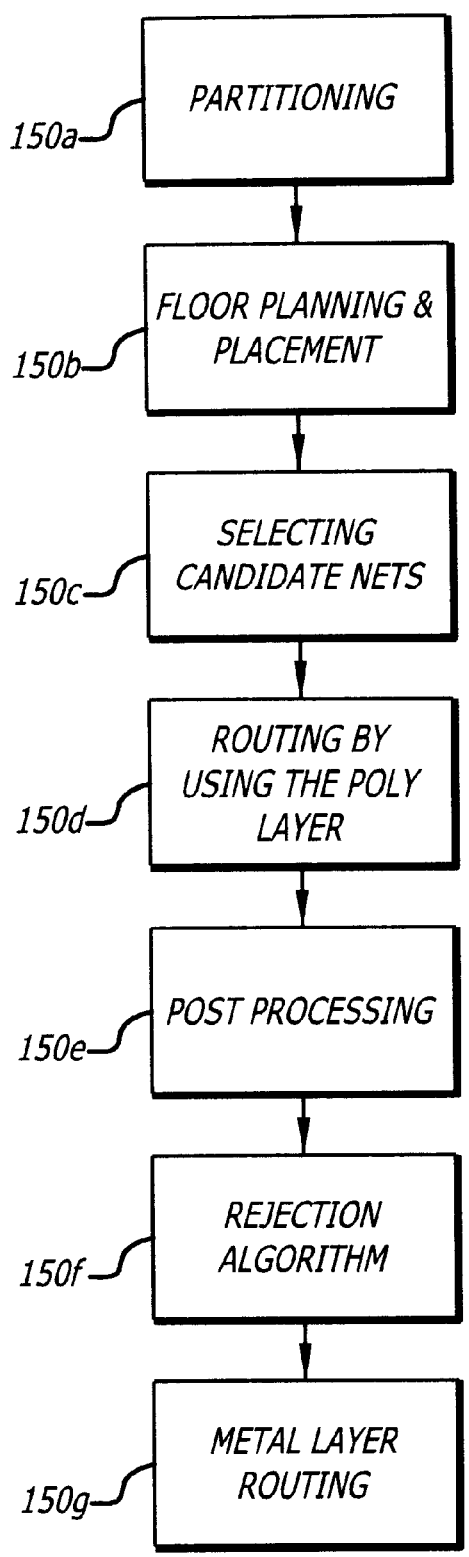
FIG. 5 is a flow diagram for illustrating integrated circuit design according to a preferred embodiment of the invention.

FIG. 5 illustrates the breakdown of the physical design step 150. In step 150a, the layout of the circuit is partitioned by grouping the components into blocks such as subcircuits and modules. In step 150b, the blocks are arranged on the chip, and the locations of the I/O pads and power pads are also decided. Floor planning is a critical step as it sets up the ground work for a good layout. During placement, the blocks are exactly positioned on the chip. The goal of placement is to find a minimum area arrangement for the blocks that allows completion of interconnections between the blocks.

In step 150c, a filtering algorithm filters the netlist to provide a set of candidate nets that are suitable for poly layer routing based on a predetermined qualification or a desired qualification which may include the number of ports or terminals in the nets and the length of the routings for the nets. In preferred embodiments of the present invention, the filtering algorithm first scans the netlist to find two port nets. The filtering algorithm rejects any nets having more than two ports as being unsuitable for poly layer routing. The filtering algorithm also rejects global nets that span the entire die and have large fanouts because the high resistance of the poly layer may cause intolerable degradation in the performance of the chip. In addition, the danger of using poly as a feed through could lead to complicated timing modeling problems for nets with fanouts greater than two, and the problem is avoided by restricting the poly routing to two port nets only. In summary, the filtering algorithm filters out all nets connecting more than two ports to prevent intolerable degradation in the performance of the chip. Since more than 50% of the nets in a typical ASIC generated by synthesis tools are two port nets, the poly layer routing of the two port nets can considerably reduce the congestion of the metal layer routing. However, it is noted that in certain embodiments of the present invention, nets with more than two terminals or ports can be routed with the poly layer, and the filtering algorithm can be adjusted to consider nets with more than two terminals or ports.

After gathering the two port nets, the filtering algorithm again filters the two port nets to find nets that have a half-perimeter bounding box less than α×LMAX (α is a predetermined factor based on the desired effect). In preferred embodiments of the present invention, α=1.5 is assumed. A bounding box is a smallest rectangle that encloses all the terminals or ports of a net. A half-perimeter bounding box is one-half the perimeter of the bounding box. The filtering algorithm rejects all two port nets with half-perimeter bounding box greater than or equal to 1.5×LMAX. As discussed before, because of the high resistance of the poly layer, all two port nets with half-perimeter bounding box greater than or equal to 1.5×LMAX are rejected by the filtering algorithm to prevent intolerable degradation of the chip performance. Therefore, only two port nets with half-perimeter bounding box less than 1.5×LMAX are considered for the poly layer routing. In addition, the filtering algorithm also filters out timing critical nets that cannot tolerate any degradation by communicating with the synthesis and placement tools used in the previous design steps. However, it is noted that the filtering algorithm is not restricted to an $\alpha=1.5$. The filtering algorithm can use a criteria of half-perimeter bounding box of less than 2.0× LMAX, for example. In certain embodiments of the present invention, the criteria used by the filtering algorithm for a can be changed based on the situation and the desired effects.

In step 150*d*, a routing tool invokes a simple routing algorithm to route and connect the two port nets that have been filtered by the filtering algorithm by analyzing the blockage tables and source/target information produced during the previous steps of the ASIC design. The routing tool routes the filtered two port nets by using the poly layer. The routing tool may use such routing algorithms as pattern based routing and maze routing, both of which are well known in the art. The routing tool may employ other routing algorithms suited for routing the filtered two port nets. Although the routing tool connects and routes the filtered two port nets using the poly layer, the routing tool is not restricted to using the poly layer exclusively. The routing tool may also use the metal layers to make the connections. However, since one of the objectives of the present invention is relieving the congestion of the metal layer routing, the routing tool uses a cost function to decide whether to use the poly layer or the metal layers for routing the two port nets. In the cost function, the poly layer is modeled to have much lower cost than the metal layers, so that the routing tool would more readily employ the poly layer to make the connections. The routing tool may use the metal layers for routing if the higher cost of the metal layers is justified by the cost function.

In step 150*e*, after the routing of the filtered two port nets is finished, a post processing step is invoked to compute the actual timing or the delay of the poly layer routes by using any timing or delay calculation formulas well known in the art such as Elmore based or AWE based timing formulas. Other timing calculation formulas may also be used.

Instead of computing the delay of the poly layer routings, the post processing step may compare the actual length of each of the poly layer routes to β×LMAX to decide whether the actual length is longer or shorter than β×LMAX (β is a predetermined factor or coefficient much like α). The post processing step can use various values for β. For example, the post processing step may use 1.0×LMAX or 0.8×LMAX. The post processing step in step 150*e* can invoke both algorithms or just one of them. The algorithm that compares the poly layer lengths to β×LMAX will probably have shorter processing time than the algorithm computing the delay of the poly layer routes. Therefore, if the processing speed is an important factor, the post processing algorithm probably should use the comparison algorithm instead of the delay computing algorithm.

In step 150*f*, a rejection algorithm rejects some of the poly layer routes based on the results from the post processing step in step 150*e*. If the post processing step used the delay computing algorithm, the rejection algorithm calculates the difference between each of the computed delays with the delay of the same net if the net was routed only by using the metal layers, and the rejection algorithm compares the calculated difference against a certain threshold value based on the tolerable degradation in the performance of the chip. If the calculated difference is more than the threshold value, the rejection algorithm rejects the corresponding poly layer routing. On the other hand, if the post processing step used the length comparison algorithm, the rejection algorithm rejects any poly layer routing longer than β×LMAX. The router reroutes the rejected poly layer routings by using the metal layers. Depending on the situation and the desired effect, the rejection algorithm can be adjusted to reject poly layer routings by using different criteria.

In step 150*g*, the router connects the remainder of the nets by using the metal layers.

By routing the qualified two port nets using the poly layer, the preferred embodiments of the present invention are relieving the congestion of the metal layer routing and freeing the metal layer resources for global nets that require metal layer routing without affecting the performance of the ASIC chip. If the metal layer routing was a constraint that dictated the die size, the poly layer routing can reduce the congestion of the metal layer routing and reduce the die size in the process without affecting the overall performance of the ASIC so that the valuable die space can be used for other important functions.

It should be noted that while the foregoing design cycle is preferred, variations of the foregoing may also be used, as will be apparent to those skilled in the art. In addition, although the foregoing design process is described and shown in FIG. 3 as being purely sequential, many times one or more of the steps will need to be repeated. That is, if the design is found to be unfeasible at one step, an earlier step might need to be re-executed to correct the problem. For example, it might occur that in step 130 a gate-level description can not be generated to satisfy the technology-independent description requirements using the available technology library, while at the same time maintaining the user's design constraints. In this case, the technology-independent description may need to be redesigned in order to achieve a feasible design. Finally, within a given step testing will very often be performed in order to verify that the design is feasible and meets all required criteria.

Figure 6:
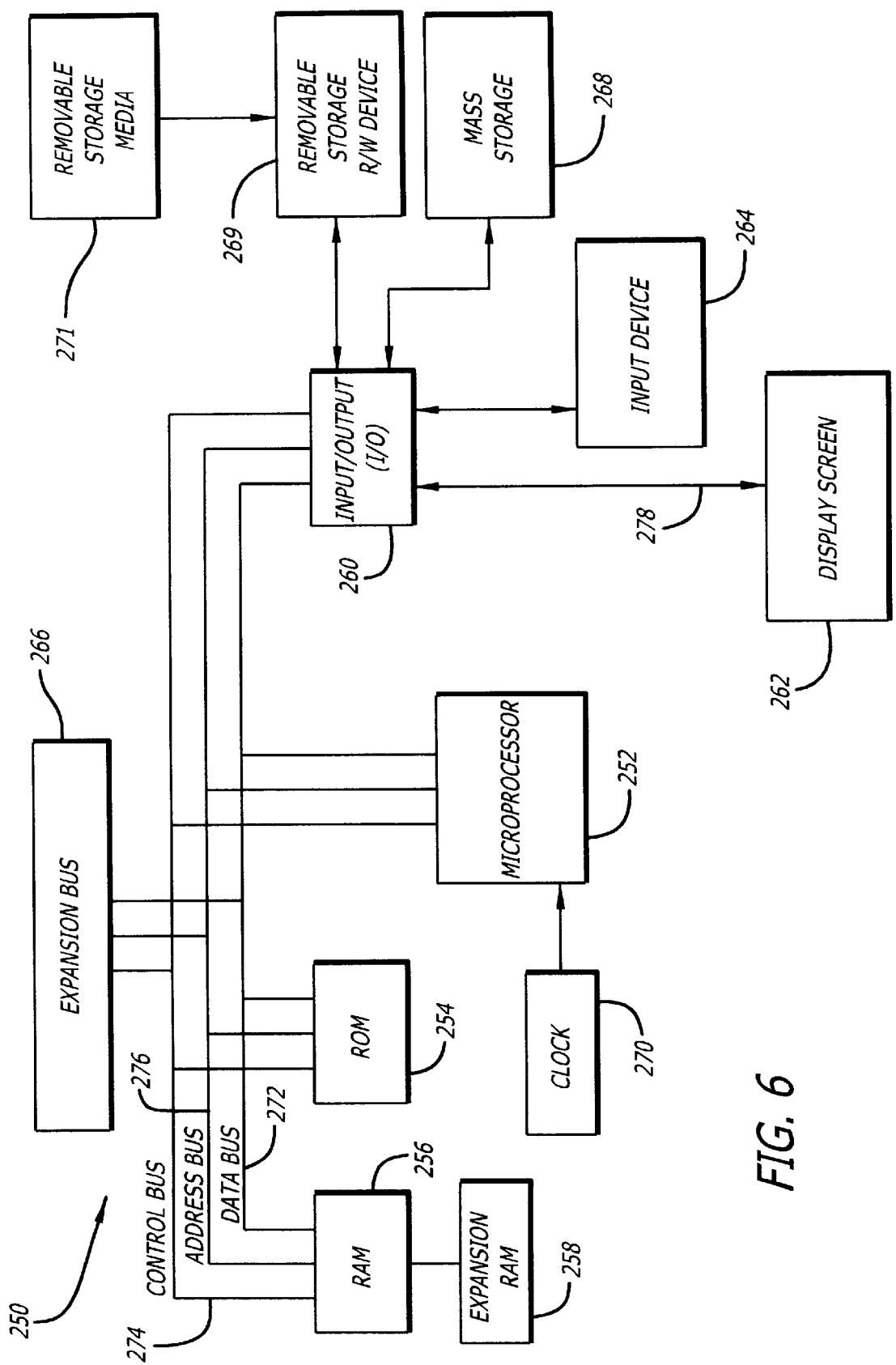
FIG. 6 is a block diagram of a general-purpose computer system, representing one suitable computer platform for implementing the methods of the invention.

Generally, the methods described herein with respect to IC design will be practiced with a general purpose computer, either with a single processor or multiple processors. The methods described herein will also be generally implemented in an ECAD system running on a general purpose computer. FIG. 6 is block diagram of a general purpose computer system, representing one of many suitable computer platforms for implementing the methods described above. FIG. 6 shows a general purpose computer system 250 in accordance with the present invention. As shown in FIG. 6, computer system 250 includes a central processing unit (CPU) 252, read-only memory (ROM) 254, random access memory (RAM) 256, expansion RAM 258, input/output (I/O) circuitry 260, display assembly 262, input device 264, and expansion bus 266. Computer system 250 may also optionally include a mass storage unit 268 such as a disk drive unit or nonvolatile memory such as flash memory and a real-time clock 270.

CPU 252 is coupled to ROM 254 by a data bus 272, control bus 274, and address bus 276. ROM 254 contains the basic operating system for the computer system 250. CPU 252 is also connected to RAM 256 by busses 272,274, and 276. Expansion RAM 258 is optionally coupled to RAM 256 for use by CPU 252. CPU 252 is also coupled to the I/O circuitry 260 by data bus 272, control bus 274, and address bus 276 to permit data transfers with peripheral devices.

I/O circuitry 260 typically includes a number of latches, registers and direct memory access (DMA) controllers. The purpose of I/O circuitry 260 is to provide an interface between CPU 252 and such peripheral devices as display assembly 262, input device 264, and mass storage 268.

Display assembly 262 of computer system 250 is an output device coupled to I/O circuitry 260 by a data bus 278. Display assembly 262 receives data from I/O circuitry 260 via bus 278 and displays that data on a suitable screen.

The screen for display assembly 262 can be a device that uses a cathode-ray tube (CRT), liquid crystal display (LCD), or the like, of the types commercially available from a variety of manufacturers. Input device 264 can be a keyboard, a mouse, a stylus working in cooperation with a position-sensing display, or the like. The aforementioned input devices are available from a variety of vendors and are well known in the art.

Some type of mass storage 268 is generally considered desirable. However, mass storage 268 can be eliminated by providing a sufficient mount of RAM 256 and expansion RAM 258 to store user application programs and data. In that case, RAMs 256 and 258 can optionally be provided with a backup battery to prevent the loss of data even when computer system 250 is turned off. However, it is generally desirable to have some type of long term mass storage 268 such as a commercially available hard disk drive, nonvolatile memory such as flash memory, battery backed RAM, PC-data cards, or the like.

A removable storage read/write device 269 may be coupled to I/O circuitry 260 to read from and to write to a removable storage media 271. Removable storage media 271 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 250 by typing on a keyboard, manipulating a mouse or trackball, or "writing" on a tablet or on position-sensing screen of display assembly 262. CPU 252 then processes the data under control of an operating system and an application program, such as a program to perform steps of the inventive method described above, stored in ROM 254 and/or RAM 256. CPU 252 then typically produces data which is output to the display assembly 262 to produce appropriate images on its screen.

Expansion bus 266 is coupled to data bus 272, control bus 274, and address bus 276. Expansion bus 266 provides extra ports to couple devices such as network interface circuits, modems, display switches, microphones, speakers, etc. to CPU 252. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, byway of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regarding the exemplary embodiments and drawings thereof, it should be apparent to those skilled in the art that various adaptations and modifications of the present invention may be accomplished without departing from the spirit and scope of the invention. Accordingly, the invention is not limited to the precise embodiment shown in the drawings and described in detail hereinabove.

What is claimed is:

1. A method for designing an integrated circuit having a polysilicon layer and metal layers, said method comprising the following steps:

generating a netlist containing nets to be routed;

selecting qualified nets from the netlist based on a predetermined qualification; and routing the qualified nets by using the polysilicon layer, wherein the predetermined qualification includes at least one of: a number of terminals in each of the nets and a length of routing for each of the nets.

2. The method of claim 1, further comprising the following step:

determining a tolerable degradation in the performance of the integrated circuit.

3. The method of claim 2, wherein said nets are for routing signals, and wherein said method further comprises the following step:

determining a maximum amount of degradation in delays of said signals based on the tolerable degradation in the performance of the integrated circuit.

4. The method of claim 3, further comprising the following step:

determining a maximum allowable length of the polysilicon layer for routing the qualified nets, wherein the maximum allowable length of the polysilicon layer does not cause degradation in the signal delays beyond the maximum amount of degradation in signal delays.

5. The method of claim 3, wherein the maximum amount of degradation is determined by comparing a signal delay for a length of the polysilicon layer with a signal delay for a same length of a metal layer.

6. The method of claim 1, further comprising the following step:

determining a maximum allowable length of the polysilicon layer to be used for routing the qualified nets.

7. The method of claim 5, wherein the predetermined qualification comprises a criteria which states that the nets must have a half-perimeter bounding box less than a predetermined factor times the maximum allowable length of the polysilicon layer.

8. The method of claim 6, further comprising the following step:

rerouting the qualified nets having a routing length in the polysilicon layer that is longer than a predetermined coefficient times the maximum allowable length of the polysilicon layer by using the metal layers.

9. The method of claim 1, wherein the routing step uses a maze routing algorithm.

10. The method of claim 1, further comprising the following step: calculating a cost function to determine whether a net is to be a qualified net, wherein the metal layers have a higher cost than the polysilicon layer.

11. The method of claim 1, further comprising the following step:

computing actual signal delays of the qualified nets routed by the polysilicon layer.

12. The method of claim 11, further comprising the following step:

rerouting the qualified nets having actual signal delays above a predetermined threshold by using the metal layers.

13. The method of claim 11, wherein the actual signal delays are computed by using an AWE based formula.

14. The method of claim 11, wherein the actual signal delays are computed by using an Elmore based formula.

15. The method of claim 1, wherein the predetermined qualification comprises a criteria which states that the qualified nets must not have more than two ports.

16. The method of claim 1, further comprising the following steps:

generating a technology-independent description of the integrated circuit; and generating a gate-level description of the integrated circuit from the technology-independent description.

17. The method of claim 1, further comprising the following step:

routing non-qualified nets by using the metal layers, wherein non-qualified nets include global nets and timing critical nets.

18. The method of claim 1, wherein the routing step uses a pattern based routing algorithm.

19. The method of claim 1, wherein the predetermined qualification includes the number of ports in each of the nets.

20. A method of routing nets in an integrated circuit having a poly layer and metal layers, said method comprising the following steps:

selecting qualified nets from the nets in the integrated circuit based on a desired qualification; and routing the qualified nets by using the poly layer, wherein the desired qualification includes the number of ports in each of the nets.

21. The method of claim 20, wherein the desired qualification further includes lengths of routings in each of the nets.

22. The method of claim 20, further comprising the following step:

determining a tolerable degradation in the performance of the integrated circuit.

23. The method of claim 22, wherein said nets are for routing signals, and wherein said method further comprises the following step:

determining a maximum amount of degradation in delays of said signals based on the tolerable degradation in the performance of the integrated circuit.

24. The method of claim 23, further comprising the following step:

determining a maximum allowable length of the poly layer for routing the qualified nets, wherein the maximum allowable length of the poly layer does not cause degradation in the signal delays beyond the maximum amount of degradation in signal delays.

25. The method of claim 23, wherein the maximum amount of degradation is determined by comparing a signal delay for a length of the poly layer with a signal delay for a same length of a metal layer.

26. The method of claim 20, further comprising the following step:

determining a maximum allowable length of the poly layer to be used for routing the qualified nets.

27. The method of claim 25, wherein the desired qualification comprises a criteria which states that the nets must have a half-perimeter bounding box less than a predetermined factor times the maximum allowable length of the poly layer.

28. The method of claim 26, further comprising the following step:

rerouting the qualified nets having a routing length in the poly layer that is longer than a predetermined coefficient times the maximum allowable length of the poly layer by using the metal layers.

29. The method of claim 20, wherein the routing step uses a maze routing algorithm.

30. The method of claim 20, further comprising the following step:

calculating a cost function to determine whether a net is to be a gualified net, wherein the metal layers have a higher cost than the poly layer.

31. The method of claim 20, further comprising the following step:

computing actual signal delays of the qualified nets routed by the poly layer.

32. The method of claim 31, further comprising the following step:

rerouting the qualified nets having actual signal delays above a predetermined threshold by using the metal layers.

33. The method of claim 31, wherein the actual signal delays are computed by using an AWE based formula.

34. The method of claim 31, wherein the actual signal delays are computed by using an Elmore based formula.

35. The method of claim 20, wherein the routing step uses a pattern based routing algorithm.

36. The method of claim 20, further comprising the following steps:

generating a technology-independent description of the integrated circuit; and generating a gate-level description of the integrated circuit from the technology-independent description.

37. The method of claim 20, further comprising the following step:

routing non-qualified nets by using the metal layers, wherein non-qualified nets include global nets and timing critical nets.

38. The method of claim 20, wherein the desired qualification includes a criteria which states that the qualified nets must not have more than two ports.

39. An apparatus for synthesizing an electronic circuit description of a system having a polysilicon layer, said apparatus comprising:

a processor for executing stored program instruction steps; and a memory connected to the processor for storing the program instruction steps, wherein the program instruction steps include:

generating a netlist containing nets to be routed;

selecting qualified nets from the netlist based on a predetermined qualification; and routing the qualified nets by using the polysilicon layer, wherein the predetermined qualification includes at least one of: a number of terminals in each of the nets and a length of routing for each of the nets.

40. An apparatus for synthesizing an electronic circuit description of a system having a poly layer and nets, said apparatus comprising:

a processor for executing stored program instruction steps; and a memory connected to the processor for storing the program instruction steps, wherein the program instruction steps include:

selecting qualified nets from the nets in the system based on a desired qualification; and routing the qualified nets by using the poly layer, wherein the desired qualification includes the number of ports in each of the nets.

41. The method of claim 40, wherein the desired qualification further includes a length of a possible routing in each of the nets.

42. An ECAD system for synthesizing an electronic circuit description of a system having a polysilicon layer from a technology-independent description of the system, said ECAD system comprising:

means for generating a netlist containing nets to be routed;

means for selecting qualified nets from the netlist based on a predetermined qualification; and means for routing the qualified nets by using the polysilicon layer, wherein the predetermined qualification includes at least one of: a number of terminals in each of the nets and a length of routing for each of the nets.

43. An ECAD system for synthesizing an electronic circuit description of a system having a poly layer and nets from a technology-independent description of the system, said ECAD system comprising:

means for selecting qualified nets from the nets in the system based on a desired qualification; and means for routing the qualified nets by using the poly layer, wherein the desired qualification includes the number of ports in each of the nets.

44. Computer-executable process steps stored on a computer readable medium, said process steps for synthesizing an electronic circuit description of a system having a polysilicon layer from a technology-independent description of the system, said process steps comprising:

inputting the technology-independent description of the system;

generating a netlist containing nets to be routed;

selecting qualified nets from the netlist based on a predetermined qualification; and routing the qualified nets by using the polysilicon layer, wherein the predetermined qualification includes at least one of: a number of terminals in each of the nets and a length of routing for each of the nets.

45. Computer-executable process steps stored on a computer readable medium, said process steps for synthesizing an electronic circuit description of a system having a poly layer and nets from a technology-independent description of the system, said process steps comprising:

selecting qualified nets from the nets in the system based on a desired qualification; and routing the qualified nets by using the poly layer, wherein the desired qualification includes the number of ports in each of the nets.

46. A method for designing an integrated circuit having a polysilicon layer and metal layers, said method comprising the following steps:

generating a netlist containing nets to be routed;

selecting qualified nets from the netlist based on a predetermined qualification;

determining a maximum allowable length of the polysilicon layer for routing the qualified nets;

routing the qualified nets by using the polysilicon layer;

rerouting each qualified net having an actual signal delay above a predetermined threshold by using the metal layers; and routing non-qualified nets by using the metal layers, wherein non-qualified nets include global nets and timing critical nets.

47. A method of routing nets in an integrated circuit having a poly layer and metal layers, said method comprising the following steps:

selecting qualified nets from the nets in the integrated circuit based on a desired qualification;

routing the qualified nets by using the poly layer;

routing non-qualified nets by using the metal layers, wherein the desired qualification includes the number of ports in each of the nets and a length of a possible routing in each of the nets, and non-qualified nets include global nets and timing critical nets.

* * * * *